Dec. 20, 1966 A. J. CARROLL 3,292,241

METHOD FOR CONNECTING SEMICONDUCTOR DEVICES

Filed May 20, 1964

INVENTOR.
Arlan J. Carroll

BY Mueller & Aichele

ATT'YS.

United States Patent Office 3,292,241
Patented Dec. 20, 1966

3,292,241
METHOD FOR CONNECTING SEMICONDUCTOR DEVICES
Arlan J. Carroll, Phoenix, Ariz., assignor to Motorola, Inc., Franklin Park, Ill., a corporation of Illinois
Filed May 20, 1964, Ser. No. 368,878
1 Claim. (Cl. 29—155.5)

This invention relates to the semiconductor art and particularly to a method of making connections to semiconductor devices and integrated circuits.

Because of its excellent adherence to silicon, germanium and their oxides as well as glass and the oxides of most metals, as well as its excellent electrical conductivity, aluminum is the metal that is most often chosen to establish contact to transisors and other components on monolithic integrated circuits and other structures which have glass and oxide covered surfaces.

In most cases, in order to use an integrated circuit it must be placed in a header or an equivalent structure having lead wires which may be plugged into a socket or a circuit board or which may be soldered to other components. To connect an integrated circuit to the leads of a header using prior art methods is a rather time consuming procedure since it is necessary to thermocompression bond tiny wires to the aluminum electrodes on the integrated circuit and then bond these wires to the larger wire leads of a header.

In order to eleminate or reduce the number of thermocompression bonds that are required to connect an integrated circuit to the header, a number of schemes have been tried, such as the use of a framework to which are attached a number of aluminum tipped fingers to replace the fine thermocompression bonded wires. This framework is so constructed that the fingers may be positioned as a unit so that the aluminum tips rest upon the aluminum electrodes of the integrated circuit so that they may be soldered together by passing the framework and integrated circuit through a soldering furnace.

Unfortunately, to solder aluminum to aluminum, high temperatures and strong fluxes are required which have a degrading effect on the components of the integrated circuits. Special alloy aluminum solders may be used and although the temperatures are not so high, a flux of some sort has been necessary in order to insure good connections by soldering. The fluxes used in aluminum soldering for the most part contain fluorides which are quite destructively reactive with the oxides and glasses common to integrated circuits.

As is well-known, to reduce the temperature required for soldering, it is customary to mix two or more metals together to obtain a solder with a lower melting point. Unfortunately, most metals which are compatible with integrated circuits, in time form compounds with the aluminum which have undesirable properties.

An object of this invention is to provide a method of soldering aluminum which requires no flux and which may be used to adjoin the aluminum to aluminum at a relatively low temperature.

A feature of this invention is the use of a thin film of germanium between two aluminum surfaces which are to be soldered in order to form a system which permits soldering without flux at a low temperature.

Figures 1, 2, 3, 4:
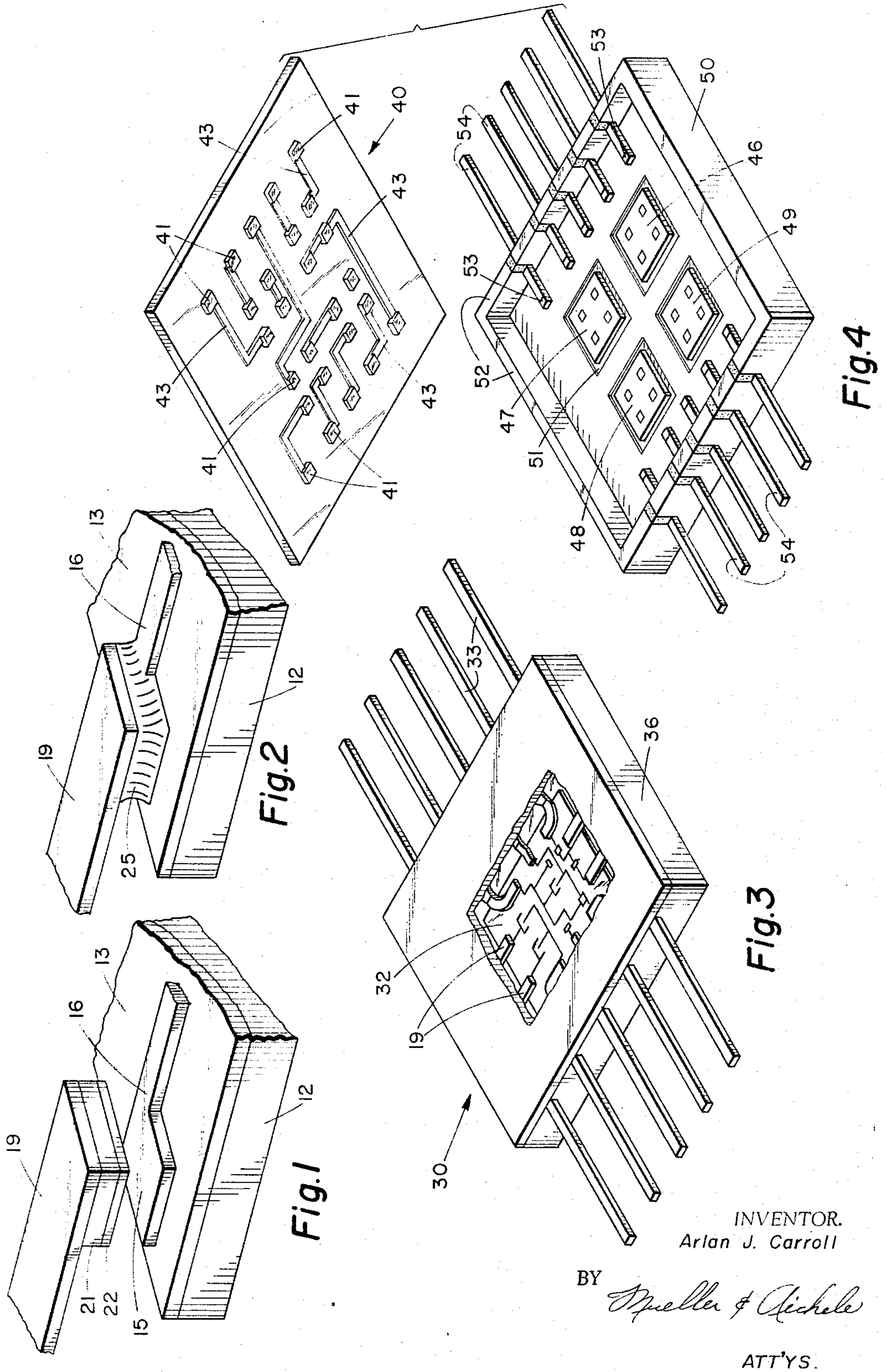
FIG. 1 is a greatly enlarged isometric view of a portion of an integrated circuit and with a metal connector finger in position over one of the integrated circuit electrodes prior to the soldering of the connector finger to the aluminum electrode of the integrated circuit.
FIG. 2 is the same view as FIG. 1 but after the soldering of the metal connector finger to the electrode has been accomplished.
FIG. 3 is a cutaway isometric view of a flat integrated circuit package.
FIG. 4 is an exploded isometric view of a flat integrated circuit package having four integrated circuits and the lid with connectors for connecting all four integrated circuits together.

In accordance with this invention aluminum soldering can be accomplished at temperatures only slightly above the aluminum-germanium eutectic by placing a thin film of germanium between regions of aluminum that are to be soldered together and then heating these materials together in a furnace having a non-oxidizing or a reducing atmosphere.

The portion of the integrated circuit shown in FIG. 1 in addition to the various electrical components, not shown, has a silicon substrate 12 covered with a film 13 of silicon dioxide or other dielectric and an electrode 15 called a "bonding island," which is of aluminum and is connected by a strip 16 of aluminum to various components of the integrated circuit. A metal finger 19 is used to provide electrical access to the integrated circuit which in its completed form is enclosed within a package (see FIG. 3). This finger 19 is coated on the end with a small pad 21 of aluminum upon which is a thin film of germanium 22 (typically from 1 to 20 microns in thickness).

To provide a soldered contact between the lead and the bonding island, a very small weight (not shown) is placed upon the finger to press the germanium 22 against the bonding island 15. The materials are then heated to above 424° C., the aluminum-germanium eutectic temperature at which point alloying of the germanium and aluminum begins. The aluminum-germanium becomes a liquid which on cooling solders the aluminum pad 21 to the bonding island 15. The soldered connection 25 is shown in FIG. 2. Since both aluminum and germanium readily oxidize at soldering temperatures, the soldering is done in an inert atmosphere or in a mildly reducing atmosphere such as is provided by a mixture of nitrogen and hydrogen gas.

FIG. 3 is a completely assembled integrated circuit device 30. Within the integrated circuit flat package 36 are shown a number of fingers 19 after they have been soldered into position onto the bonding islands of an integrated circuit 32. The fingers are merely continuations of the leads 33 which extend through the sides of the flat package.

Each connection made by soldering eliminates two thermocompression bonding operations with their attendand expense and in addition provides a connection which is at least as good as the thermocompression bonded connection if not superior to it. Due to the fact that fluxes are not required and no adverse effects result from the use of a germanium, the result is a completed integrated circuit device which is superior to those in which connections are made by thermocompression bonding. Incidentally, thermocompression bonding as presently practiced must be done at a considerable higher temperature than is required for soldering according to this invention and thus has a somewhat degrading effect on various integrated circuit components.

The present soldering method is also quite useful in attaching a number of integrated circuits together within a single enclosure.

A manner of connecting a number of integrated circuits together is indicated by the exploded view of FIG. 4. A piece of glass 40 with aluminum strips 43 is shown in position over four integrated circuits 46, 47, 48 and 49 within a flat header 50. Recesses 51 are provided in the header 50 to receive each of the four integrated circuits and hold them in proper orientation relative to each other and to aluminum pads 41 on the glass 40. The recesses 51 are coated with aluminum and a thin film of germanium and the bottom surface (not shown) of each integrated circuit is also coated with an aluminum film. The glass 40 is positioned by the side walls 52 of the header 50.

The glass 40 is the lid of the flat package. The aluminum strips 43 are evaporated directly on the glass 40 with larger amounts of aluminum being deposited to form raised pads 41 of aluminum at the various portions corresponding to the locations of the aluminum coated tips 53 of the leads 54 and the aluminum bonding islands on the four integrated circuits 46, 47, 48 and 49 upon which the aluminum strips 43 are to be soldered to interconnect the circuits and leads. When a sufficient amount of aluminum has been deposited on these regions to raise them to provide clearance so that the strips 43 do not touch the circuits 46, 47, 48 and 49, then a thin film (not shown) of germanium is deposited on top of each of them. The connections are completed by putting the lid in place on the header and soldering the pads to the islands by heating the assembly above the aluminum-germanium eutectic temperature. The integrated circuits are also soldered into the recesses during this heating step.

Aluminum to aluminum connections which are prepared in accordance with this invention are adequately strong for most integrated circuit applications and have a low electrical resistance. Since connections of this type may be made at low temperature and without flux, they are especially well-suited for use in making connection to highest quality integrated circuits and semi-conductor devices.

What is claimed is:

A method of interconnecting a number of monolithic integrated circuits having bonding islands of aluminum comprising:

(a) forming an aluminum coating on a surface of each of a number of integrated circuits opposite to that on which bonding islands are disposed, (b) forming an aluminum coating on portions of a header, (c) depositing a film of germanium material on said aluminum coated portions, (d) positioning said integrated circuits on said header with said aluminum coated surfaces of said integrated circuits in contact with said germanium film portions of said header, (e) forming metal strips on a dielectric substrate, (f) forming raised pads of aluminum on said metal strips and depositing a film of germanium material on said pads, (g) positioning said dielectric substrate with respect to said integrated circuits and said header so that said raised pads rest on said bonding islands of said integrated circuits, (h) heating said bonding islands, raised pads, aluminum coatings and germanium material above 424° C. to form aluminum-germanium alloys, and (i) cooling said alloys to secure said integrated circuits to said header and said metal strips to said bonding islands to interconnect said integrated circuits.

References Cited by the Examiner

UNITED STATES PATENTS

| | | | |
|---|---|---|---|
| 3,107,414 | 10/1963 | Sterling | 29—502 X |
| 3,180,022 | 4/1965 | Briggs | 29—502 X |
| 3,200,490 | 8/1965 | Clymer | 29—502 X |

JOHN F. CAMPBELL, *Primary Examiner.*

WILLIAM I. BROOKS, *Examiner.*